(12) United States Patent
Edwards

(10) Patent No.: US 6,232,809 B1
(45) Date of Patent: May 15, 2001

(54) DIFFERENTIAL INPUT COMPARATOR WITH DOUBLE SIDED HYSTERESIS

(75) Inventor: Arthur James Edwards, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/607,653

(22) Filed: Jun. 30, 2000

(51) Int. Cl.[7] ............................ H03K 3/12; H03K 3/037; H03K 3/286; H03K 3/356
(52) U.S. Cl. .............................. 327/205; 327/206; 327/65
(58) Field of Search ........................... 327/51–54, 63–67, 327/563, 205–206, 74, 76; 330/252

(56) References Cited

U.S. PATENT DOCUMENTS

| | | | |
|---|---|---|---|
| 5,039,888 | 8/1991 | Bell et al. | 327/73 |
| 5,656,957 | * 8/1997 | Marlow et al. | 327/67 |
| 5,894,234 | * 4/1999 | Morris | 327/65 |
| 6,127,868 | * 10/2000 | Phillips | 327/205 |
| 6,163,190 | * 12/2000 | Takai et al. | 327/205 |
| 6,172,536 | * 1/2001 | Yoshihara | 327/205 |

* cited by examiner

Primary Examiner—Terry D. Cunningham
Assistant Examiner—Long Nguyen

(57) ABSTRACT

A current-controlled differential input comparator having a double sided hysteresis is provided, including a differential input comparator having a first comparator input, a second comparator input, a comparator output, and a switching threshold, wherein the switching threshold causes the comparator output to have a first output state when the first comparator input is greater than the second comparator input and to have a second output state when the first comparator input is less than the second comparator input, a first hysteresis resistor communicating with the first comparator input, a second hysteresis resistor communicating with the second comparator input, an inverter connected to the comparator output, the inverter generating an inverted comparator output, and a current supply connected to the comparator output and to the inverted comparator output, the current supply being capable of switching a first hysteresis current to the first hysteresis resistor and a second hysteresis current to the second hysteresis resistor, wherein the double sided hysteresis is created by the first hysteresis current flowing through the first hysteresis resistor and by the second hysteresis current flowing through the second hysteresis resistor.

12 Claims, 3 Drawing Sheets

DIFFERENTIAL INPUT COMPARATOR WITH DOUBLE SIDED HYSTERESIS

BACKGROUND OF THE INVENTION

1. Field of the Invention

The present invention relates generally to a differential input comparator, and more particularly to a differential input comparator with double sided hysteresis and which is capable of operating independently of a DC voltage supply level.

2. Description of the Background Art

Noise detection is very important in electronics, as known noise in a circuit may be removed, attenuated, or at least compensated for. One area in particular where electromagnetic noise is a problem is in a motor vehicle. The vehicle generates on-board electricity through use of an alternator. The alternator generates an alternating current (AC) type of voltage. However, almost all vehicles operate on direct current (DC) due to the need to store the generated electricity in a battery. Therefore, the alternating current produced by the alternator must be rectified to convert it into direct current. A voltage regulator receives the direct current and monitors voltage levels available to the vehicle.

The rectification does not remove all of the AC components from the generated electrical current. A remaining noise signal, an artifact of the originally produced AC voltage, rides on top of the rectified DC voltage signal.

If the frequency of the AC noise is known, it can be more easily filtered. The AC noise also may be used for other purposes. One beneficial use of the AC noise is the detection of the noise frequency and therefore the RPM of the alternator. The alternator's rotational speed may be used for various purposes. For example, the alternator speed may be used to keep the alternator switched off during engine starting or during periods of heavy engine load. A zero alternator speed may indicate when the alternator drive belt is broken. And, the alternator speed may be inputted to a voltage regulator to compare the output voltage to the actual alternator speed and give a warning when the alternator output voltage is too low.

The AC noise signal frequency is detected by using a differential detector and comparator to convert the AC signal into a square wave output. A frequency counter receives the square wave output and counts the square waves in a certain period of time to obtain a frequency. The square waves are produced by comparing the AC signal with a delayed version of itself. This is particularly common for cases where two "different" signals from the same source exist, as in the case of two phase signals being output from either an alternator or the ends of an inductive pickup coil.

A problem in the prior art is that due to the noisy nature of the AC signal, the conventional differential comparator cannot simply compare the two signals. Noise (or an invalid signal) can easily cause a differential comparator to improperly change state. The presence of an extra pulse or pulses caused by noise or waveform impurity can generate a false "high frequency" measurement, resulting in an erroneous change in an alternator operating mode.

A prior art approach to making the frequency detection more accurate and reliable is through addition of an offset or hysteresis to the comparison. In the prior art, a differential comparator may attempt to address the problem through a positive feedback resistor that generates hysteresis. For example, if the comparator is configured to output a logic one when input B is greater than input A, the addition of a voltage offset or hysteresis means that input B must exceed input A by the offset amount before the comparator outputs a logic one.

FIG. 1 shows a conventional differential comparator 100. The differential comparator 100 carries out the differential detection using a comparator stage 104. The comparator stage 104 is preceded by an offset stage 107 that adds an offset to one input signal via a resistor RPH1 and a current source $M_8$ that provides a current $I_{M8}$. Due to the offset stage 107, the offset voltage level is $(RPH1+RPH1A)*I_{M8}$ (V=IR as given by Ohm's Law), plus a voltage component from the output resistance of $M_{44}$. The voltage component from the output resistance of $M_{44}$ is balanced by the output resistance of $M_{45}$ due to the current $I_{M9}$ (here $I_{M9}=I_{M8}$). Therefore, an input signal at PHIN2 will have to go above an input signal at PHIN1 by this offset amount before the state of the comparator stage 104 is changed.

FIG. 2 shows a differential comparator output B>A when the comparator has a single offset. The comparator output is a logic one only when input B is greater than input A by the offset amount. Therefore, small ripples in inputs A or B will not affect the comparator output.

FIG. 3, however, shows a comparator double output drawback in the conventional art. In this example, the comparator 100 outputs a logic one when input A is greater than input B. At time $\cdot_2$ the noise on input A causes two comparator output pulses where there should be only one. This is caused by the noise on input A, wherein input A momentarily drops below the offset value, causing the related art comparator output to momentarily drop to an incorrect logic zero value. It is therefore desirable to require a first input to exceed a second input by an offset amount in going both above and below the second input.

An additional drawback of the conventional differential comparator 100 is that, since the input DC voltage level is not fixed, a voltage-controlled hysteresis level will cause the hysteresis level to vary with the DC voltage operating point, lessening the benefit of the hysteresis as the DC voltage drops (i.e., if the DC voltage drops, the amount of hysteresis drops, increasing the probability of an improper comparator output).

What is needed, therefore, is an improved differential input comparator having symmetrical hysteresis and capable of operating independently of a DC voltage supply level.

SUMMARY OF THE INVENTION

A current-controlled differential input comparator having a double sided hysteresis is provided according to the invention. The current-controlled differential input comparator comprises a differential input comparator having a first comparator input, a second comparator input, a comparator output, and a switching threshold, wherein the switching threshold causes the comparator output to have a first output state when the first comparator input is greater than the second comparator input and to have a second output state when the first comparator input is less than the second comparator input, a first hysteresis resistor communicating with the first comparator input, a second hysteresis resistor communicating with the second comparator input, an inverter connected to the comparator output, the inverter generating an inverted comparator output, and a current supply connected to the comparator output and to the inverted comparator output, the current supply being capable of switching a first hysteresis current to the first hysteresis resistor and a second hysteresis current to the second hysteresis resistor, wherein the double sided hysteresis is created by the first hysteresis current flowing through the first hysteresis resistor and by the second hysteresis current flowing through the second hysteresis resistor.

The above and other features and advantages of the present invention will be further understood from the following description of the preferred embodiments thereof, taken in conjunction with the accompanying drawings.

DETAILED DESCRIPTION OF THE PREFERRED EMBODIMENTS

The present invention addresses the problems in the conventional art by providing a current-controlled differential input comparator with symmetrical hysteresis. The hysteresis is symmetric about the comparator threshold, so that frequency detection is stable and accurate. In addition, the circuitry of the present invention is advantageous in that the present invention is not voltage dependent, and the amount of hysteresis will not change as the DC operating voltage drifts.

Figure 4:
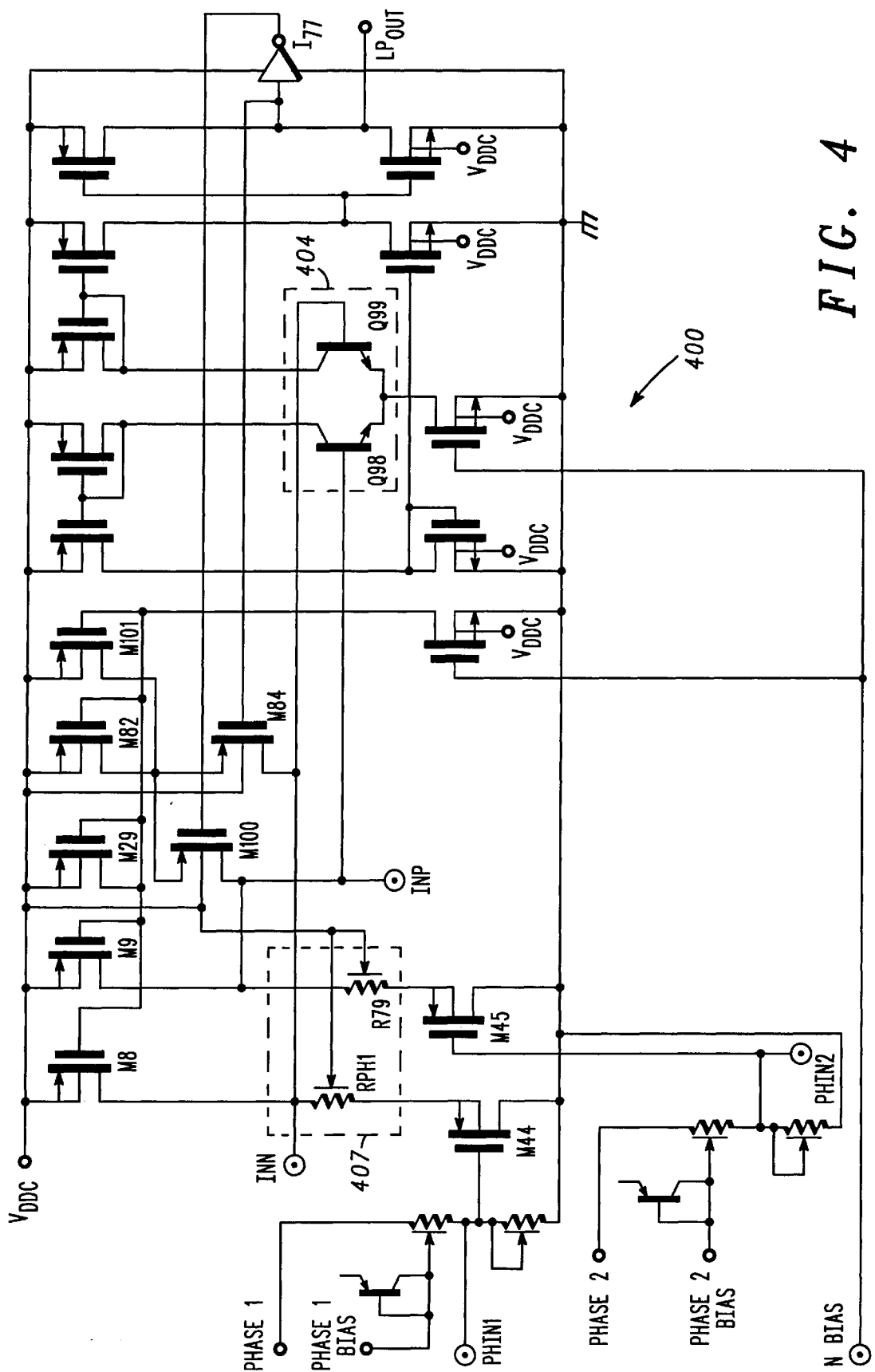
FIG. 4 shows a current-controlled differential input comparator of the present invention, having a double-sided hysteresis.

FIG. 4 shows a current-controlled differential input comparator 400 of the present invention, having a double-sided hysteresis. The current-controlled differential input comparator 400 includes a comparator stage 404, an inverter $I_{77}$, an offset stage 407, and current supply switches $M_{84}$ and $M_{100}$.

The offset stage 407 includes offset resistors RPH1 and R79. The offset resistor RPH1 receives a first hysteresis current $I_{M84}$ while the offset resistor R79 receives a second hysteresis current $I_{M100}$. These currents create the hysteresis voltages:

$$V_{RPH1}=I_{M84}*RPH1$$

$$V_{R79}=I_{M100}*R79$$

respectively, to give positive voltage feedback to the comparator 404 and therefore hysteresis. The currents $I_{M84}$ and $I_{M100}$ are not switched on at the same time. It should be noted that the resistors RPH1 and R79 may be of different or equal values. Likewise, the currents $I_{M84}$ and $I_{M100}$ may be different or equal. In order to achieve symmetrical hysteresis, the resistances and currents should be chosen to create equal hysteresis voltages $V_{RPH1}$ and $V_{R79}$.

The current is steered in the circuit by two switches $M_{84}$ and $M_{100}$. The two switches $M_{84}$ and $M_{100}$ are preferably PMOS transistors, but alternatively may be any other transistor having suitable characteristics. An inverter $I_{77}$ provides the anti-phase drive for switch $M_{100}$.

In operation, as an illustrative example, assume that PHIN1 is much larger than PHIN2 (i.e., the input PHIN1 is experiencing a waveform peak while the input PHIN2 is experiencing a waveform trough). The output LPOUT will be low (logic zero), while transistor M84 will be ON (logic one) and transistor $M_{100}$ will be OFF. The current ($I_{M8}$+$I_{M84}$) therefore flows through the hysteresis offset resistor RPH1, generating the offset voltage $V_{RPH1}$ at the input INP.

When the input signal at PHIN1 ramps down to a level below the input signal at PHIN2, as the voltage level at point INN reaches the voltage level of INP (i.e., PHIN1+$V_{RPH1}$=PHIN1+RPH1*($I_{M82}$+$I_{M101}$=PHIN2), the comparator 404 (i.e., transistors $Q_{98}$ and $Q_{99}$) starts to switch states. When the voltage at LPHX is sufficiently low, the inverter 413 (i.e., $M_{37}$ and $M_{48}$) will give a HIGH voltage output level to the comparator output LPOUT. This will turn OFF the switch $M_{84}$ and will turn ON the switch $M_{100}$, thus switching the offset voltage from RPH1 to R79, and giving positive feedback/hysteresis. The overall result is that the offset voltage $V_{R79}$ is added to the INN input signal when the INN input signal is larger than the INP input signal.

The same operation happens in reverse as PHIN1 starts to go higher than PHIN2 again. Of course, since this is a differential system, both PHIN1 and PHIN2 can be varying with respect to ground at the same time. In the alternator application this is certainly the case, as the two alternator phase signals are sine waves about 120 degrees apart in phase.

The added components, with the exception of the resistors RPH1 and R79, can be MOS type transistors, and are extremely compact. No significant additional die area may be needed. Therefore, the present invention adds symmetrical hysteresis to a differential input comparator in a very economical fashion. In addition, since all of the components are fabricated in the same IC area, the matching of the components may be very exact. Since it is the impedance ratios of RPH1 to R79 that control the circuit operation, the differential input comparator is very accurate and very reproducible.

Figure 1:
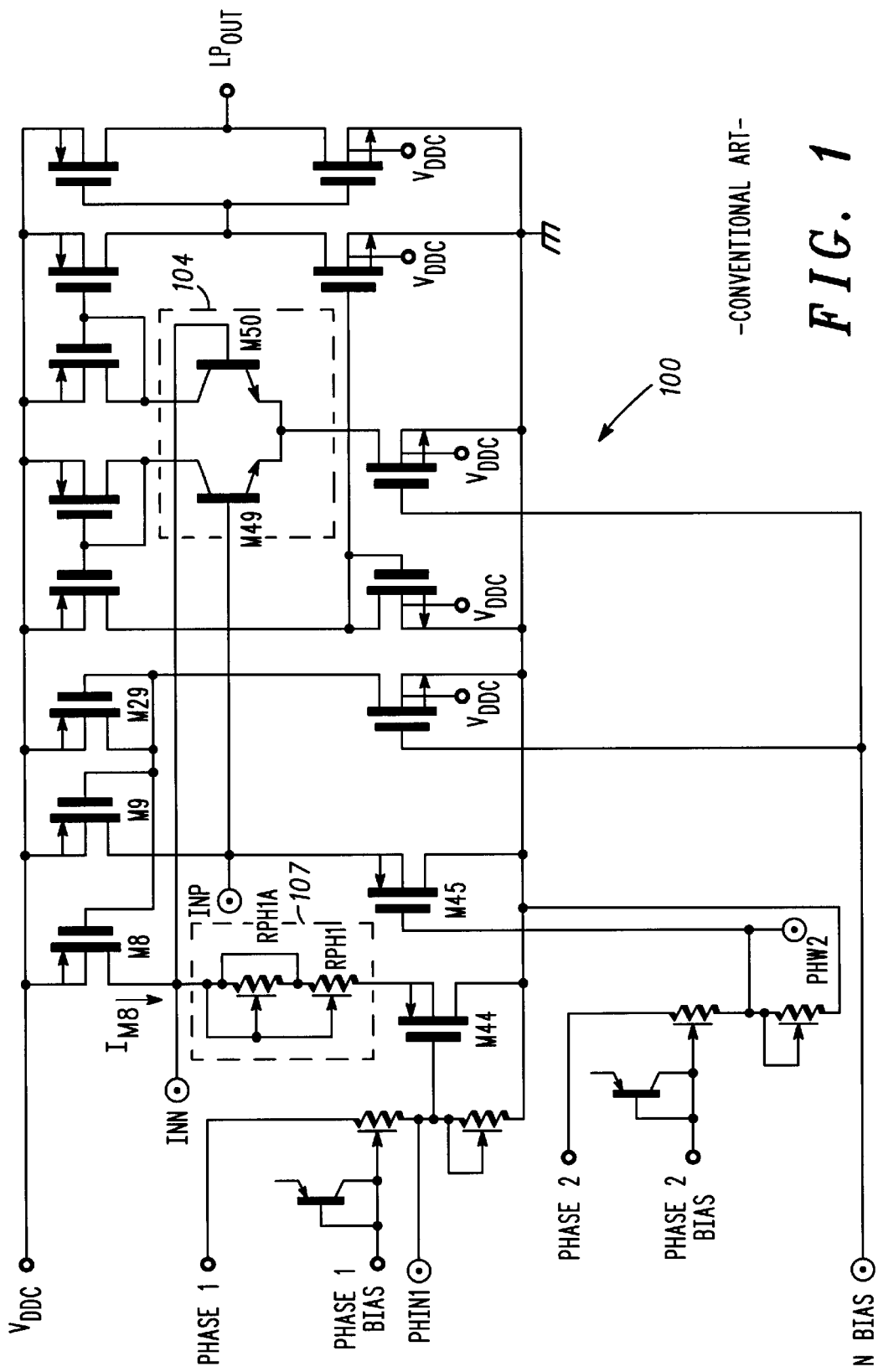
FIG. 1 shows a conventional art differential comparator.
Figure 2:
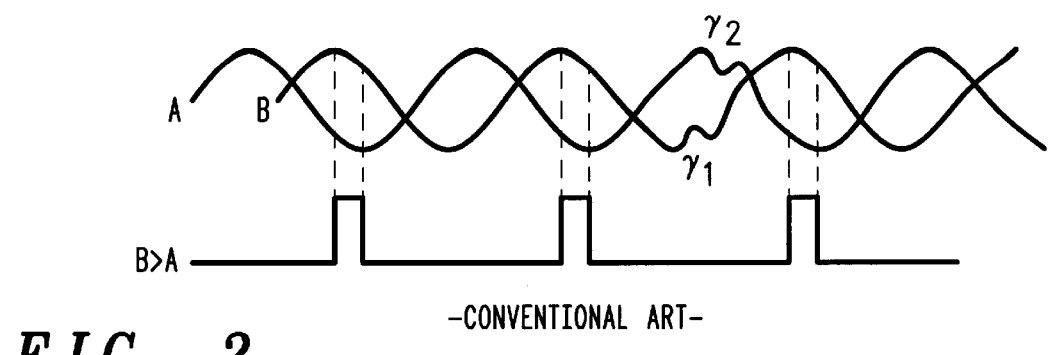
FIG. 2 shows a conventional art differential comparator output B>A when the comparator has a single offset.
Figure 3:
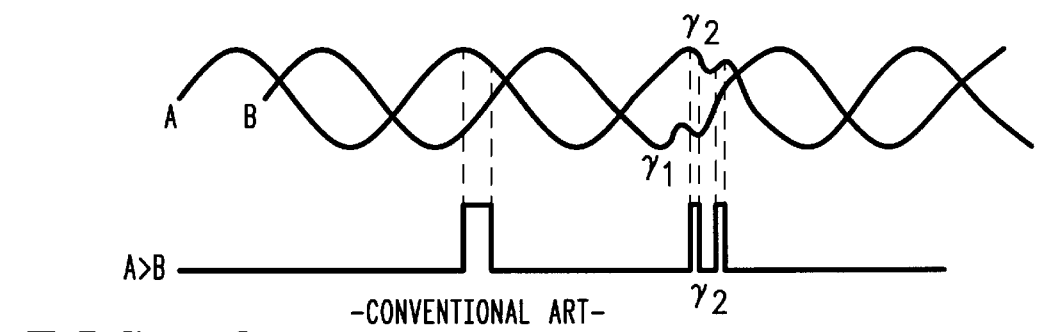
FIG. 3 shows a comparator double output drawback in the conventional art.
Figure 5:
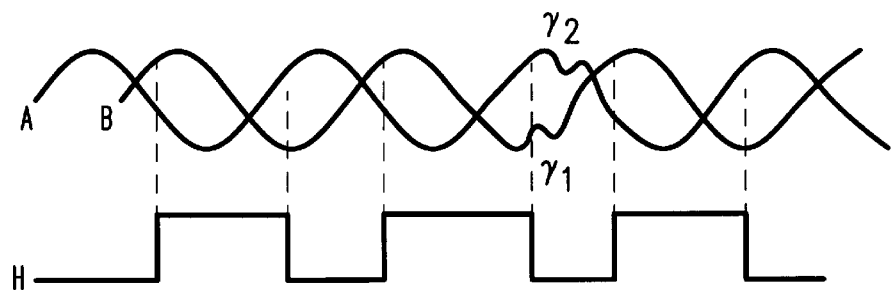
FIG. 5 shows a comparator output of the current-controlled differential input comparator of the present invention.

FIG. 5 shows a comparator output of the current-controlled differential input comparator 400 of the present invention. In this example the comparator output is a logic one when input B is greater than input A. At time $\bullet_1$, when signal B does not exceed the hysteresis value, the comparator output stays at a logic one level. Therefore, using the differential comparator with the symmetrical hysteresis of the present invention, the result of noise is only a change in duty cycle of the comparator output, not a change in frequency. Thus, the comparator switches to a low logic state only when signal B goes below signal A by an offset amount equal to the offset amount by which signal B must exceed signal A to cause the comparator to switch to a high logic state.

While the invention has been described in detail above, the invention is not intended to be limited to the specific embodiments as described. It is evident that those skilled in the art may now make numerous uses and modifications of and departures from the specific embodiments described herein without departing from the inventive concepts.

What is claimed is:

1. A current-controlled differential input comparator having a double sided hysteresis, comprising:

a differential input comparator having a first comparator input, a second comparator input, a comparator output, and a switching threshold, wherein said switching threshold causes the comparator output to have a first output state when a signal at said first comparator input is greater than a signal at said second comparator input and to have a second output state when a signal at said first comparator input is less than a signal at said second comparator input;

a first hysteresis resistor communicating with said first comparator input;

a second hysteresis resistor communicating with said second comparator input;

an inverter connected to said comparator output, said inverter generating an inverted comparator output; and a current supply connected to said comparator output and to said inverted comparator output, said current supply being functional to switch a first hysteresis current to said first hysteresis resistor and a second hysteresis current to said second hysteresis resistor in response to a change in said comparator output;

wherein said double sided hysteresis is created by said first hysteresis current flowing through said first hysteresis resistor and by said second hysteresis current flowing through said second hysteresis resistor.

2. The differential input comparator of claim 1, wherein said first hysteresis current and said second hysteresis current are constant currents.

3. The differential input comparator of claim 1, wherein a hysteresis level is set by a resistance value in conjunction with a current level.

4. The differential input comparator of claim 1, wherein a first generated hysteresis level is different from a second generated hysteresis level.

5. The differential input comparator of claim 1, wherein a first generated hysteresis level is substantially equal to a second generated hysteresis level.

6. The differential input comparator of claim 1, wherein said first hysteresis resistor is fed said first hysteresis current by a first switch, and wherein said second hysteresis resistor is fed said second hysteresis current by a second switch, with said first switch being controlled by said comparator output and said second switch being controlled by said inverted comparator output.

7. The differential input comparator of claim 1, wherein said current supply is formed of two PMOS transistors, with a first current supply transistor gate being connected to said inverted comparator output and a first current supply transistor drain being connected to said first hysteresis resistor for passing said first hysteresis current there through, and with a second current supply transistor gate being connected to said comparator output and a second current supply transistor drain being connected to said second hysteresis resistor for passing said second hysteresis current there through.

8. A double sided hysteresis differential input comparator, comprising:

a differential input comparator having a first comparator input, a second comparator input, a comparator output, and a switching threshold which causes said comparator output to have a first output state when a first signal at said first comparator input is greater than a second signal at said second comparator input, and to have a second output state when said first signal at said first comparator input is less than said second signal at said second comparator input;

hysteresis means connected to said first comparator input, said second comparator input, and said comparator output, for supplying a first hysteresis current as an offset to said first comparator input when said comparator output is at said first output state, and for supplying a second hysteresis current as an offset to said second comparator input when said comparator output is at said second output state;

whereby said first signal must be greater than said second signal by said first hysteresis current offset in order to cross said switching threshold to said first output state, and must be less than said second signal by said second hysteresis current offset in order to cross said switching threshold to said second output state.

9. The double sided hysteresis differential input comparator of claim 8, wherein said first hysteresis current and said second hysteresis current are constant currents.

10. The double sided hysteresis differential input comparator of claim 8, wherein a hysteresis level is set by a resistance value in conjunction with a current level.

11. The double sided hysteresis differential input comparator of claim 8, wherein a first generated hysteresis level is different from a second generated hysteresis level.

12. The double sided hysteresis differential input comparator of claim 8, wherein a first generated hysteresis level is substantially equal to a second generated hysteresis level.

* * * * *